Feb. 17, 1970 J. E. SAKELLAKIS 3,496,419

PRINTED CIRCUIT BREADBOARD

Filed April 25, 1967

INVENTOR

JOHN E. SAKELLAKIS

BY

Oberlin, Maky, Donnelly & Renner

ATTORNEYS

United States Patent Office 3,496,419

Patented Feb. 17, 1970

3,496,419

PRINTED CIRCUIT BREADBOARD

John E. Sakellakis, Cleveland Heights, Ohio, assignor to J. R. Andresen Enterprises, Inc., Cleveland, Ohio, a corporation of Ohio Filed Apr. 25, 1967, Ser. No. 633,562

Int. Cl. H02b 1/04, 9/00

U.S. Cl. 317—101 3 Claims

ABSTRACT OF THE DISCLOSURE

A printed circuit breadboard for experimental design and testing of circuits employing discrete components or integrated circuit modules providing pad-like extensions for the leads to the electrical components whereby tack soldering of interconnections may be facilitated.

This invention relates to a new and improved breadboard for experimental circuits in a printed circuit configuration providing a relatively inexpensive and highly practical means for designing and testing various electronic circuits.

Many different types of breadboards have been used in the past in relation to experimental circuits and it is the purpose of all these devices to provide a means whereby various electronic components may be interconnected swiftly and efficiently and may be readily removed from the circuit for substitution of components of different values and the like while the circuit is undergoing testing. Due to recent advances in the electronics art whereby discrete components have been reduced in size and now with the introduction of integrated circuits wherein very small packages are involved, the problems of connecting these components into a particular circuit while still retaining the flexibility of changing components, substituting different values and monitoring the circuit operation by means of meters and the like have become relatively difficult.

In the past, certain basic types of breadboards for these test purposes have received extensive use, one of these being the type which utilizes solderless connectors for readily connecting the components into the circuit and providing a convenient release of same. These breadboards might comprise a board having a plurality of prepunched holes into which are inserted various types of push-in terminals to provide a common point for joining components. Such terminals may consist of a coil spring mounted on a post which is inserted into the hole and wherein the components are slipped between the coils of the spring to be frictionally retained in position and to provide an abutting type of electrical contact. Similarly, other types of terminals might consist of a slotted post having a serrated notch into which lead wires are forced to provide the mechanical and electrical connection. Still other types of breadboard arrangements have common junction points comprising a slot or an opening into which the complement leads are inserted and soldered in place.

These prior art designs are unwieldy and often unreliable in that special terminals must be placed in the various holes provided and if a soldered connection is not used are often subject to loose connections which make it difficult to accurately test a circuit containing a very large number of components. Similarly, it is often necessary in these prior art devices, because of the size of terminals used and the fact that they cannot be closely located together, to bend the lead wires from the components and in the case of devices such as transistors and glass encased diodes and the like, these devices would often be damaged in the initial mounting and/or removal of same. Additionally, such terminals, because they protrude from the breadboard a certain extent, provide a rather cluttered finished circuit which is inconvenient for the designer to manipulate and is often the cause of inadvertent short circuits, misconnections and the like. Another disadvantage of these devices is that because of the bulk of the terminal junction a rather large heat sink is provided which when heated for soldering the connections dissipates much heat by the lead connection to the sensitive components of the circuit affecting their characteristics.

Therefore, it is an object of this invention to provide an improved breadboard for experimental circuits which is relatively uncomplicated in design and which provides the advantages of conforming to the package design of existing active components and integrated circuits to alleviate mechanical stresses in the mounting of these components on the board yet providing convenient accessibility to the leads of the components.

It is another object of this invention to provide an improved breadboard of printed circuit configuration which eliminates the necessity for maintaining a supply of terminals, junctions and the like for insertion into the board and which provides an uninterrupted planar surface which is uncluttered of devices unnecessary to the operation of the circuit.

It is still another object of this invention to provide an improved printed circuit breadboard which allows tack soldering of components and interconnecting wires for ready connection, removal or substitution of same.

It is a further object of this invention to provide an improved printed circuit breadboard which exhibits a reduced heat sink capacity at junction points to prevent destruction and/or alteration of characteristics of components.

It is a still further object of this invention to provide an improved printed circuit breadboard which is especially advantageous at high frequency levels of operation due to the small capacitance effects between junctions on the terminal board and because a high density of components may be packaged on the board.

It is a still further object of this invention to provide an improved printed circuit board which is especially advantageous with critical low signal level circuits where the circuit may be readily shielded from extraneous effects in the original manufacture of the breadboard.

Other objects and advantages of the present invention will become apparent as the following description proceeds.

To the accomplishment of the foregoing and related ends the invention, then, comprises the features hereinafter fully described and particularly pointed out in the claims, the following description and the annexed drawing setting forth in detail a certain illustrative embodiment of the invention, this being indicative, however, of but one of the various ways in which the principle of the invention may be employed.

Figure 1:
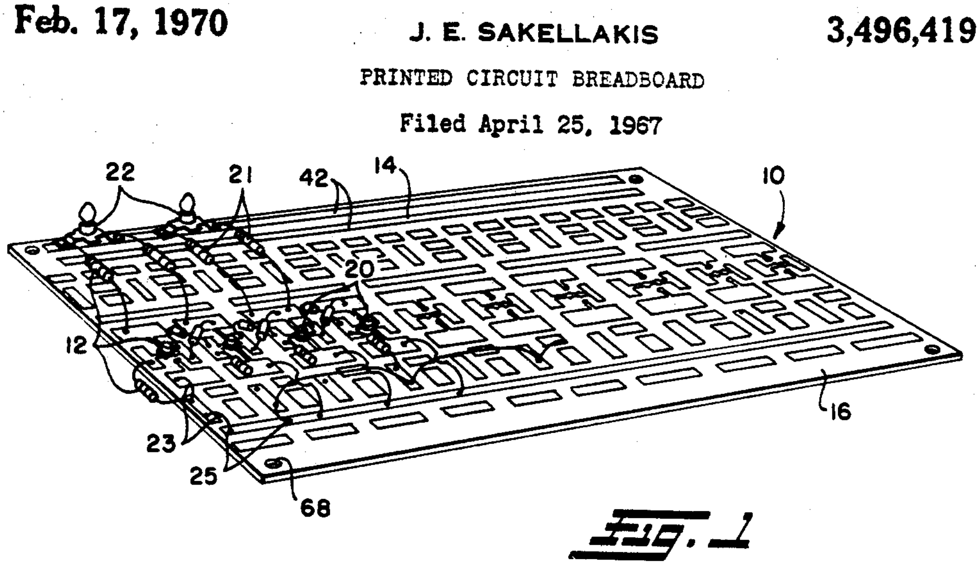
FIG. 1 is an isometric view of a printed circuit breadboard of the invention showing a plurality of components in a typical tack soldered arrangement on a portion of the board.

Referring now to FIG. 1, there is shown a printed circuit breadboard 10 having a plurality of discrete components 12 tacked thereon forming a portion of a typical computer circuit. The printed circuit board 10 used in this invention has a thin sheet of copper material 14 bonded to a phenolic base 16 where portions of the copper have been etched away to leave a desired configuration of copper remaining on the base 16. For purposes of this invention any conventional type of printed circuit board may be utilized and any techniques for producing the desired configuration of the conductive patterns upon the board may be employed.

This embodiment of the invention shows a configuration of the conducting copper material 14 on only one side of the base 16. However, the teachings of this invention are not to be construed as so limited thereto and as will be pointed out in more detail hereinafter for certain applications, the teachings of this invention may be employed with circuit boards which are copper clad on both sides using the second side as a duplication of the first or as providing a convenient manner of shielding the circuitry mounted on the board. As seen in FIG. 1, several components including transistors 20, resistors 21, indicator lights 22 and connecting wires 23 are tack soldered as shown at 25 to the copper portions of the board 10 and it will be apparent from this showing of the invention that this breadboard provides a relatively uncluttered circuit wherein the layout and experimentation with the circuit may be conveniently made by the designer.

The circuit experimenter usually has a soldering device at his convenience since the method of soldering components 12 together is preferred in that it provides a reliable, mechanical and electrical connection which is not subject to vibrational breakdowns in the usual environments encountered in testing of the circuits and eliminates a source of inconsistencies in the circuit. Because the soldering iron is readily at hand it is no more inconvenient for the experimenter to tack solder the components 12 onto the printed circuit board 10 than to mount them in specialized clips, terminal lugs and the like.

Figure 2:
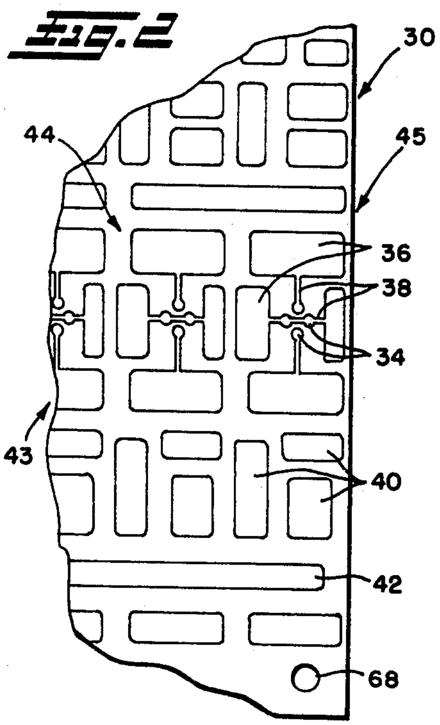
FIG. 2 is a fragmentary plan view of a printed circuit breadboard of the invention suited for discrete components such as, for example, the transistor shown in FIG. 2*a*.
Figure 2A:
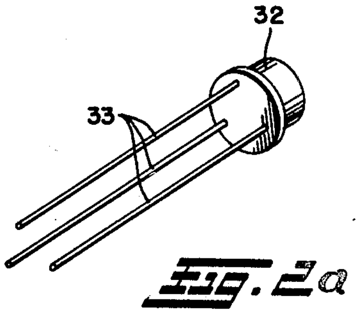

Referring now to FIG. 2, there is shown a portion of a printed circuit breadboard 30 designed particularly for discrete electronic components and in particular for transistors having a case design similar to the TO–5 outline configuration, such transistor 32 being shown in FIG. 2*a*. Four component connection points 34 are provided on the board 30 in an equally spaced relationship for direct soldering of the leads 33 of the transistor 32 to mount the transistor 32 to the printed circuit board 30. Although it is common for a transistor to have only emitter, collector and base leads, such configuration of the connection points 34 shown is advantageous in allowing the transistor 32 to be oriented differently for various types of circuits. The connection points 34 are small discs of an area only slightly greater than the cross-sectional area of the leads of the transistor 32 to be mounted thereon. Four pads 36 corresponding to each of the connection points 34 are also provided, displaced a distance from the connection points 34 and connection thereto by thin conductive links 38.

Thus, in a typical mounting, the leads 33 of the transistor 32 will be soldered to a connection point 34 and thus, to their respective pads 36 by way of the respective connecting links 38. The spacing of the connection points 34 in this embodiment of the invention is such as to conform to the actual lead 33 spacing of the transistor 32 component itself. The transistor leads 33 may be connected directly to the connection points 34 without the necessity of bending the leads 33 and of causing any injury to the component. Similarly, the transistor 33 leads may be made as short as desired and it will be apparent that the planar surface of the printed circuit breadboard 30 of this invention is conducive to facilitating the soldering of short leads wherein the tip of a soldering iron may be brought within the space between the board and the component itself.

The size and the spacing of the pads 36 with respect to the connection points 34 and links 38 is not critical but the relative dimensions shown are the preferred embodiments which provides suitable area for tacking a plurality of components 12 or connecting wires 23 to a particular pad 36 while not being so great as to cause an appreciable amount of heat transfer through the connecting link 38 to the connection point 34 and to the component 12.

As is well understood in the art, the operation of tack soldering does not involve a great deal of heat transfer from the soldering iron since it is only necessary to bring a small area to a temperature high enough to cause the solder to flow over the component 12 lead and the area to be soldered. It is also well understood that such area of soldering is relatively small and previous components which have been soldered in place on a particular pad will not become unsoldered when a new lead is attached to the pad. The amount of heat produced in performing one tack soldering operation on a pad is further prevented from reaching the component by the minimal dimensions of the connecting link 38 of conductive material.

In relation to the spacing of the pads 36 and the connection points 34, components other than transistors which are connected to the board may have their lead wires bent at suitable points. This usually presents no problem since these devices, most commonly resistors and capacitors, are relatively sturdy. Similarly, these components need not be cut to minimal dimensions since their lead wires are effective to reach to remote portions of the circuit and since it is usually desired to remove these devices intact for further experimental use. It will be appreciated that a particular circuit design can be constructed in a breadboard configuration in a relatively rapid manner by use of this invention since only the components 12 themselves and the few necessary connecting wires 23 need be soldered to appropriate portions of the printed circuit breadboard 10. Additional pads 40 of conductive material are provided in spaced relation to the connection points 34 to serve as junctions for other components of the circuit not directly connected to the transistor. With printed circuit boards especially, it is convenient to provide common conductive paths 42 assoiated with a plurality of these pad groupings 43–45 for common potentials which are used throughout a complete circuit such as the ground and the source voltage potentials.

Figure 3:
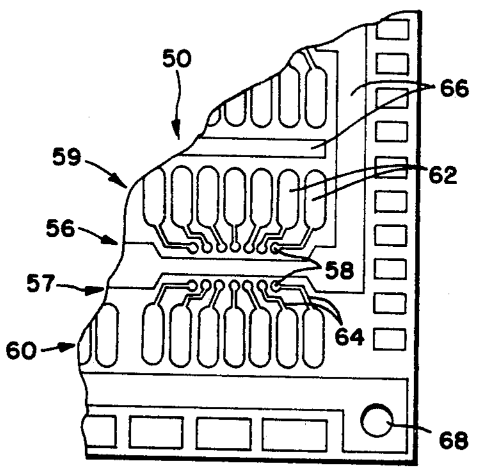
FIG. 3 is a fragmentary plan view of a printed circuit board of the invention especially suited for integrated circuits of the package configuration shown in FIG. 3*a*.
Figure 3A:
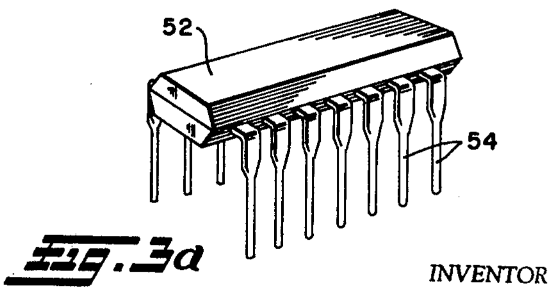

Referring now to FIG. 3, there is shown a portion of a printed circuit breadboard 50 utilizing the teachings of this invention which is particularly suitable for circuits with integrated circuit modules in standardized case designs, a typical module 52 being shown in FIG. 3*a*. These integrated circuit modules are relatively small and have a plurality of closely spaced leads 54, a complete module 52 being on the order of an inch in length and the spacing of the leads 54 being on the order of tenths of an inch. In this embodiment of the invention, two rows 56, 57 of seven connection points 58 each are aligned in parallel relation and two rows 59, 60 of seven pads 62 each corresponding to each of the connection points 58 are spaced outwardly therefrom and in expanded relation. The pads 62 are of oblong shape and are designed to provide suitable area for mounting a plurality of leads while providing suitable spacing for ready access to the soldering points. The pads 62 are connected to the connection points 58 by conductive links 64 of suitable configuration and the relative size and thermal characteristics pointed out with respect to the printed circuit breadboard 30 for the discrete components in FIG. 2 are similarly applicable in this embodiment. Common conductive paths 66 of the circuit are also provided and are interleaved among the pads 62 and connector points 58 for each module to provide common connections for ground and bias potentials and the like.

As has been indicated previously, the edge-to-edge relationship of the individual pads 36, 62 in both the integrated circuit and the discrete component configurations provides minimal common area between the pads and other portions of the circuit and provides minimal capacitance effects in the operation of the circuit. Extraneous effects can be further minimized by utilizing a circuit board which is copper clad on both sides with the breadboard configuration etched on only a single side thereby leaving a complete copper surface for shielding the circuitry. Similarly, because the breadboard is of a printed circuit configuration the circuit components may be tacked in a closely spaced realtion to the board itself to provide a completed circuit of very little volume. This is especially significant in computer type circuits wherein a plurality of these boards may be so constructed and mounted in closely spaced relation to provide a complete circuit. Mounting holes 68 are provided on each of these breadboards and various boards may be stacked together by suitable fasteners and spacers to attain a relatively small package.

I, therefore, particularly point out and distinctly claim as my invention:

1. A printed circuit breadboard assembly comprising at least one electronic component of standard package configuration having at least three connecting leads emanating from the package and arranged in a definite array, a breadboard comprising insulative support means in sheet form and thin conductive material bonded on said support means in a definite pattern of coplanar areas, said conductive material comprising a plurality of first and second groups of pads, said groups of pads being arranged in parallel rows, at least one strip of said conductive material extending parallel to the rows of said groups of pads for electrically interconnecting said groups, each group having a number of pads therein corresponding to the number of connecting leads of said electronic component, each pad of said first group being of area only slightly greater than the cross-sectional area of the connecting lead of said component for tack-soldering of such lead thereto, each pad of said second group being of substantially greater area than each pad of said first group, the pads of each of said first and second groups being arranged with respect to one another in an array similar to the array of the connecting leads of said electronic component, the pads of said first group being in an array identical to the connecting lead array of said electronic component, the pads of the second group being in expanded relation to the pads of said first group, single links connected between each pad of said first group and the corresponding pad of said second group, said links being narrow strips of conductive material for electrically connecting and thermally isolating said groups of pads, and means for electrically and mechanically bonding the connecting leads of said electronic component to said pads of said first group.

2. Apparatus as set forth in claim 1 wherein said electronic component is a transistor having three connecting leads and two of said links are parallel to one another and perpendicular to the third of said links, and further including fourth pads in each of said groups, a fourth link connecting said fourth pads, said fourth link being parallel to said third link and said fourth pads being disposed in a symmetrical array with the pads of said first and second groups, and a further link of conductive material connecting said third and fourth links.

3. A printed circuit breadboard for mounting and interconnecting printed circuit components of standard package configuration, each such component having fourteen connecting leads emanating from the package and arranged in a definite array of two parallel rows of seven leads, the breadboard being formed of insulative support means in sheet form and thin conductive material bonded on said support means in a definite pattern for providing coplanar areas on which connecting leads may be tack-soldered, said conductive material comprising a plurality of first and second groups of pads, said groups of pads being arranged in parallel rows, each group having fourteen pads therein corresponding to the number of connecting leads of the electronic component, each pad of said first group being of area only slightly greater than the cross-sectional area of the connecting lead of the component for tack-soldering of such lead thereto, each pad of said second group being of substantially greater area than each pad of said first group, the pads of each of said first and second groups being arranged with respect to one another in an array similar to the array of the connecting leads of the electronic components, with the pads of said second group being in expanded relation to the pads of said first group, single links connected between each pad of said first group and the corresponding pad of said second group, said links being narrow strips of conductive material for electrically connecting and thermally isolating said groups of pads, and strips of said conductive material extending in rows between and parallel to said groups of pads for electrically interconnecting said groups.

References Cited

UNITED STATES PATENTS

| | | |
|---|---|---|
| 3,074,181 | 1/1963 | Watson. |
| 3,353,139 | 11/1967 | Ribbelink. |
| 3,302,067 | 1/1967 | Jackson et al. |
| 3,373,481 | 3/1968 | Lins et al. |
| 3,390,308 | 6/1968 | Marley. |

FOREIGN PATENTS

| | | |
|---|---|---|
| 884,285 | 12/1961 | Great Britain. |

OTHER REFERENCES

Van Dam, Netherlands Printed Application No. 289,-945, Pub. June 10, 1965.

DARRELL L. CLAY, Primary Examiner

U.S. Cl. X.R.

29—626; 174—68.5; 339—17